(12) United States Patent
Akiyama et al.

(10) Patent No.: US 6,391,796 B1
(45) Date of Patent: May 21, 2002

(54) METHOD FOR HEAT-TREATING SILICON WAFER AND SILICON WAFER

(75) Inventors: Shoji Akiyama; Norihiro Kobayashi, both of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/530,602

(22) PCT Filed: Sep. 7, 1999

(86) PCT No.: PCT/JP99/04841

§ 371 Date: May 3, 2000

§ 102(e) Date: May 3, 2000

(87) PCT Pub. No.: WO00/16386

PCT Pub. Date: Mar. 23, 2000

(30) Foreign Application Priority Data

Sep. 14, 1998 (JP) .......................................... 10-279367

(51) Int. Cl.[7] .............................................. H01L 21/31
(52) U.S. Cl. ...................... 438/763; 117/102; 117/104; 117/97
(58) Field of Search ................... 438/763, 14; 117/102, 117/104, 97

(56) References Cited

U.S. PATENT DOCUMENTS

| | | | |
|---|---|---|---|
| 5,718,762 A | * 2/1998 | Habuka et al. | ............... 117/97 |
| 5,770,263 A | 6/1998 | Hawthorne et al. | |
| 5,846,321 A | * 12/1998 | Habuka et al. | ............. 117/102 |
| 5,885,346 A | * 3/1999 | Habuka et al. | ............. 117/104 |
| 5,998,281 A | * 12/1999 | Aga et al. | .................... 438/459 |
| 6,008,128 A | * 12/1999 | Habuka et al. | ............. 438/695 |
| 6,162,741 A | * 12/2000 | Akasaka et al. | ............ 438/773 |

FOREIGN PATENT DOCUMENTS

| | | |
|---|---|---|
| JP | 62230693 | 10/1987 |
| JP | 8-264552 | 10/1996 |
| JP | 10-176693 | 6/1998 |
| JP | 11-40540 | 2/1999 |
| JP | 11-354529 | 12/1999 |

OTHER PUBLICATIONS

H. Habuka et al.; "In situ cleaning method for silicon surface using hydrogen fluoride gas and hydrogen chloride gas in a hydrogen ambient"; Journal of Crystal Growth; vol. 186, No. 1–2;1998, pp. 104–112.

(List continued on next page.)

*Primary Examiner*—John F. Niebling
*Assistant Examiner*—Olivia T Luk
(74) *Attorney, Agent, or Firm*—Oliff & Berridge, PLC

(57) ABSTRACT

In a method for heat treatment of silicon wafers under a reducing atmosphere utilizing an RTA apparatus, in particular, microroughness on silicon wafer surfaces is reduced, thereby improving electric characteristics such as oxide dielectric breakdown voltage and mobility of carriers, and generation of slip dislocations and heavy metal contamination are suppressed. Thus, improvement of yield and productivity, and cost reduction are contemplated. According to the present invention, there is provided a method for heat treatment of a silicon wafer under a reducing atmosphere containing hydrogen using a rapid heating/rapid cooling apparatus, wherein a natural oxide film on a silicon wafer surface is removed, and then the silicon wafer is subjected to a heat treatment under an atmosphere of 100% hydrogen or an inert gas atmosphere containing 10% or more of hydrogen using a rapid heating/rapid cooling apparatus.

8 Claims, 8 Drawing Sheets

OTHER PUBLICATIONS

N. Sato et al.; "Hydrogen annealed silicon–on–insulator"; Applied Physics Letters; vol. 65, No. 15; Oct. 1994; pp. 1924–1926.

H. Habuka et al., "Processing of Si Substrate in Normal–Pressure Hydrogen Before Epi–growth", *The Transaction of Japanese Crystal Growth Society*, vol. 24, No. 2, Jul. 1, 1997, p. 144.

A. Ando et al.—Extended Abstracts (The 56th Autumn Meeting, 1995), *The Japanese Society of Applied Physics*, 27p–ZV–13.

S. Yamakawa et al., "Study of Interface Roughness Dependence of Electron Mobility in Si Inversion Layers Using the Monte Carlo Method", *J. Appl. Phys.* 79 (2), Jan. 15, 1996, pp. 911–916.

\* cited by examiner

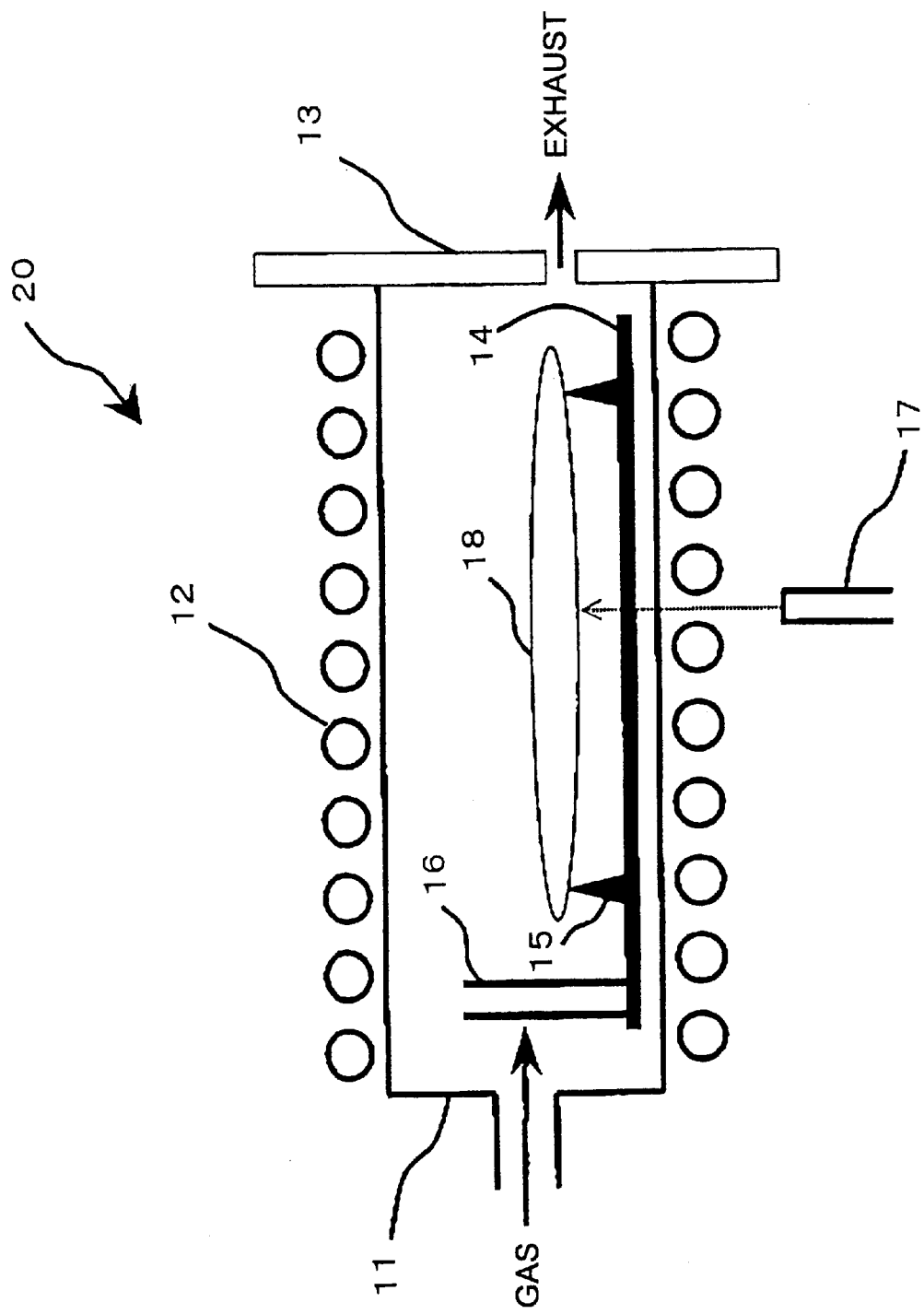

METHOD FOR HEAT-TREATING SILICON WAFER AND SILICON WAFER

TECHNICAL FIELD

The present invention relates to a method for heat treatment of a silicon wafer, in particular, such a heat treatment method which can improve microroughness on a silicon wafer surface and can suppress generation of slip dislocations and heavy metal contamination, as well as a silicon wafer of high quality useful for semiconductor devices, which is obtained by the heat treatment.

BACKGROUND ART

In recent years, use of higher integration degree of MOS-LSI has made gate oxide films increasingly thinner. And in order to obtain reliability of such thin oxide films, quality of silicon wafers as substrates is considered important. Inter alia, microroughness on surfaces of wafers attracts much attention.

More precisely, with the use of higher integration degree of MOS structure transistors, it has become necessary to improve the mobility of carriers (electrons and holes) immediately under the oxide layer in the MOS structure. Moreover, with the use of increasingly higher driving frequency of CPU (central processing unit), higher writing and reading speeds of memories are of course required, and therefore improvement of the carrier mobility has become an important research subject.

Further, it has become clear that microroughness on wafer surfaces is closely related to performance and reliability of devices as a factor greatly affecting the electric characteristics such as the oxide dielectric breakdown voltage and the mobility of carriers (see Shinya Yamakawa et. al., J. Appl. Phys. 79, 911, 1996).

As a method for reducing the microroughness of wafer surface, there has been known, for example, a method which comprises applying an electric current to the wafer surface using a special apparatus such as an ultra high vacuum apparatus (see Ando et al., Extended Abstracts (The 56th Autumn Meeting, 1995); The Japan Society of Applied Physics, 27p-ZV-13, 1995). However, it takes long time to obtain ultra high vacuum, and it also takes long time to return the vacuum to atmospheric pressure. This causes a problem that one must always pay attention to adhesion of particles during those process steps.

Further, as a method for improving the microroughness, there is already the proposal of Japanese Patent Application No. 10-176693, and sufficiently small microroughness has been obtained. In this technique, however, heat treatment is performed at a high temperature by using a rapid heating and rapid cooling apparatus under a reducing atmosphere with multiple steps. Therefore, the process becomes complicated and problems may arise in productivity, durability of the apparatus, generation of slip dislocations, heavy metal contamination and so forth.

Usual silicon wafers have a $SiO_2$ layer called natural oxide film on their surfaces. In order to remove this film, hydrogen annealing at a high temperature of about 1200° C. is required. However, such hydrogen annealing has problems such as the generation of slip dislocations and the heavy metal contamination from the inside of the system. Therefore, it is necessary to simultaneously achieve a lower temperature of the whole process and improvement of microroughness. It is considered that lowering temperature of the whole process will become still more important because relative mechanical strength of wafers will become weaker as a larger diameter of wafers is used in future.

DISCLOSURE OF THE INVENTION

The present invention has been accomplished in view of the aforementioned problems, and its object is to provide a method for heat treatment of silicon wafers under a reducing atmosphere utilizing a rapid heating/rapid cooling apparatus (also referred to as RTA (Rapid Thermal Annealer) apparatus hereinafter), which can, in particular, afford further reduced microroughness on silicon wafer surfaces by heat treatment at a lower temperature compared with conventional techniques, improve electric characteristics such as the oxide dielectric breakdown voltage and the mobility of carriers, and suppress generation of slip dislocations and heavy metal contamination, as well as utilize the advantages proper to the rapid heating/rapid cooling apparatus, for example, improved yield and productivity, low cost and so forth.

In order to achieve the aforementioned object, the present invention provides a method for heat treatment of a silicon wafer under a reducing atmosphere using a rapid heating/rapid cooling apparatus, wherein a natural oxide film on a silicon wafer surface is removed, and then the silicon wafer is subjected to a heat treatment under an atmosphere of 100% hydrogen or a mixed gas atmosphere of argon and/or nitrogen containing 10% or more of hydrogen using a rapid heating/rapid cooling apparatus.

If, in a method for heat treatment of a silicon wafer under a reducing atmosphere using a rapid heating/rapid cooling apparatus, the silicon wafer is subjected to a heat treatment under an atmosphere of 100% hydrogen or a mixed gas atmosphere of argon and/or nitrogen containing 10% or more of hydrogen using a rapid heating/rapid cooling apparatus after a natural oxide film on a silicon wafer surface is removed as described above, microroughness on the wafer surface can surely be reduced while maintaining the state of the wafer that the natural oxide film is removed. At the same time, crystal defects existing on the wafer surface can also be eliminated, and thus there can be obtained a silicon wafer useful for semiconductor devices with extremely few defects and excellent electric characteristics.

In this case, the aforementioned heat treatment can be performed at a temperature of 950 to 1150° C. for 1–300 seconds.

By subjecting a wafer from which a natural oxide film is removed to a heat treatment at a lower temperature compared with conventional techniques for a short period of time using a rapid heating/rapid cooling apparatus, the microroughness can markedly be reduced. Moreover, since the heat treatment temperature is relatively lowered, the temperature of the whole process is also lowered. Therefore, the generation of slip dislocations is substantially eliminated, the problem of heavy metal contamination is also solved, and the yield is improved. Furthermore, since time and thermal energy required for temperature increase and decrease can also be reduced, improvement of productivity and cost reduction can also be contemplated.

The present invention also relates to the method for heat treatment of a silicon wafer, wherein the natural oxide film is removed by hydrofluoric acid treatment.

$SiO_2$ constituting the natural oxide film can easily and surely be dissolved and removed by immersion in hydrofluoric acid (HF) or gaseous phase treatment utilizing HF gas, and original flatness, microroughness and so forth of a mirror-finished wafer before the treatment are not substantially affected adversely.

Furthermore, because the microroughness of the wafer surface is improved by the method for heat treatment of the present invention, there can be obtained a silicon wafer of extremely high quality useful for semiconductor devices, which has improved electric characteristics such as the oxide dielectric breakdown voltage and the mobility of carriers, and is substantially free from generation of slip dislocations and heavy metal contamination.

In particular, there can be obtained a silicon wafer having a microroughness of 1.00 nm or less in terms of P–V value and 0.12 nm or less in terms of RMS value as determined by an atomic force microscope for a 2 µm square.

As explained above in detail, by subjecting a silicon wafer from which a natural oxide film is removed to a heat treatment at a relatively low temperature under a reducing atmosphere of 100% hydrogen or a mixed gas atmosphere of argon and/or nitrogen containing 10% or more of hydrogen using a rapid heating/rapid cooling apparatus, microroughness on the wafer surface can markedly be reduced. As a result, there can be obtained a silicon wafer of excellent crystallinity, which has excellent electric characteristics such as the oxide dielectric breakdown voltage and the mobility of carriers, and is substantially free from generation of slip dislocations and heavy metal contamination. At the same time, improvement of yield and productivity can be contemplated, and cost reduction can be achieved.

BRIEF EXPLANATION OF THE DRAWINGS

FIGS. 4A and 4B are schematic sectional views of exemplary apparatuses that can realize rapid cooling/rapid heating of a silicon wafer.

BEST MODE FOR CARRYING OUT THE INVENTION

Figure 1:
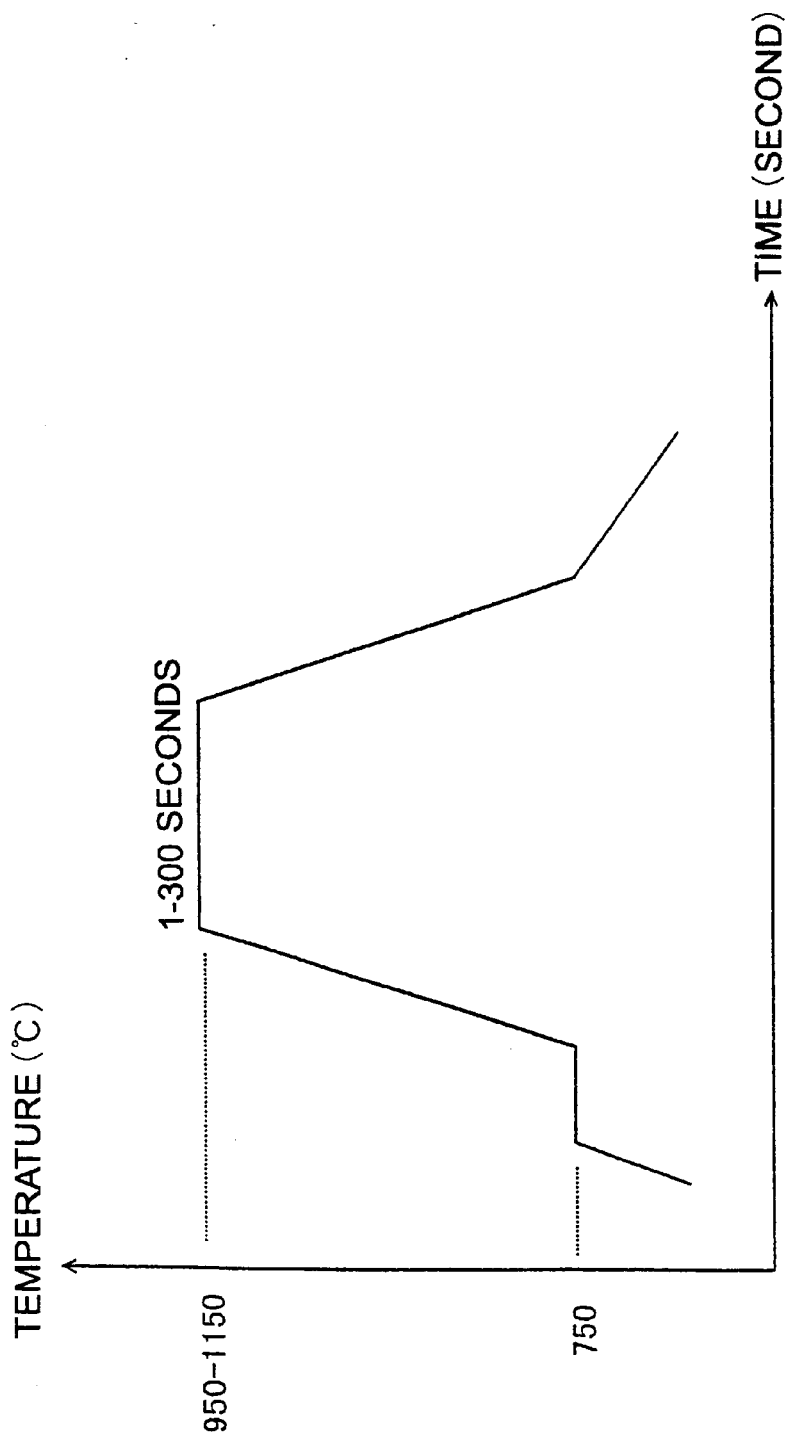
FIG. 1 shows an exemplary heat treatment process according to the present invention using a rapid heating/rapid cooling apparatus.

Hereafter, the present invention will be explained in more detail.

The inventors of the present invention studied thorough various searches and experiments about heat treatment conditions that can reduce microroughness existing on a silicon wafer surface, thereby improving electric characteristics such as the oxide dielectric breakdown voltage and the mobility of carriers, and can obviate generation of slip dislocations and heavy metal contamination, which are likely to occur during heat treatment at a high temperature. As a result, they found that a silicon wafer with small microroughness could be obtained by subjecting a silicon wafer of which natural oxide film is removed to a heat treatment at a temperature lower than the conventional temperature under a reducing atmosphere which consists of 100% hydrogen gas or inert gas containing 10% or more of hydrogen gas by using an RTA apparatus. The inventors of the present invention further investigated various conditions therefor, and thus completed the present invention.

In the conventional hydrogen annealing utilizing an RTA apparatus, a heat treatment at a high temperature of about 1200° C. or higher is required in order to remove a natural oxide film formed on a silicon wafer surface. Under hydrogen atmosphere within the range of 900–1100° C., the ratio of etching rates of Si and $SiO_2$ is generally represented as $Si/SiO_2$=2 to 100. That is, the etching rate of $SiO_2$ is slower, and hence it requires higher temperature.

Therefore, if the natural oxide film ($SiO_2$) formed on the wafer surface is removed by hydrofluoric acid treatment as a pretreatment before the heat treatment by an RTA apparatus, it becomes unnecessary to etch $SiO_2$ by an RTA apparatus, and therefore the temperature of the whole process can be lowered. Further, it was considered that, even if the process temperature was lowered compared with the conventional temperature, the effect on reduction of microroughness could be comparable to, or even more effective than that of the conventional treatment at around 1200° C., and it was attempted to confirm if this idea was correct or not by experiments.

First, the following experiment was performed in order to establish suitable heat treatment conditions for silicon wafers by a rapid heating/rapid cooling apparatus. As the heat treatment apparatus, an RTA apparatus provided with lamp heaters (rapid heating/rapid cooling apparatus Model SHS-2800, Steag Microtec International) was used.

The silicon wafers used were those obtained by slicing a silicon ingot manufactured by the Czochralski method in a conventional manner and subjecting the sliced wafers to mirror polishing, and having a diameter of 8 inches and crystal orientation of <100>.

As the method for removing natural oxide films, the silicon wafers were immersed in 2% hydrofluoric acid (HF) solution for 3 minutes.

Two kinds of samples, samples having natural oxide films and samples whose natural oxide films were removed as described above were prepared.

Measurement of microroughness was performed by an AFM (Atomic Force Microscope, NanoScope-II, tradename of Digital Instrument Inc.) for a 2 µm square. The microroughness of mirror-finished wafers before heat treatment was 1.1 nm or more in terms of the P–V value (maximum difference between peaks and valleys), and 0.13 nm or more in terms of the RMS value (root mean square roughness).

As for the conditions of the heat treatment, there were employed atmospheric gas composition consisting of 25% by volume of hydrogen and 75% by volume of argon, treatment temperature of 1000 to 1200° C., and treatment time of 1–30 seconds. A diagram of an exemplary heat treatment process is shown in FIG. 1.

Figure 2:
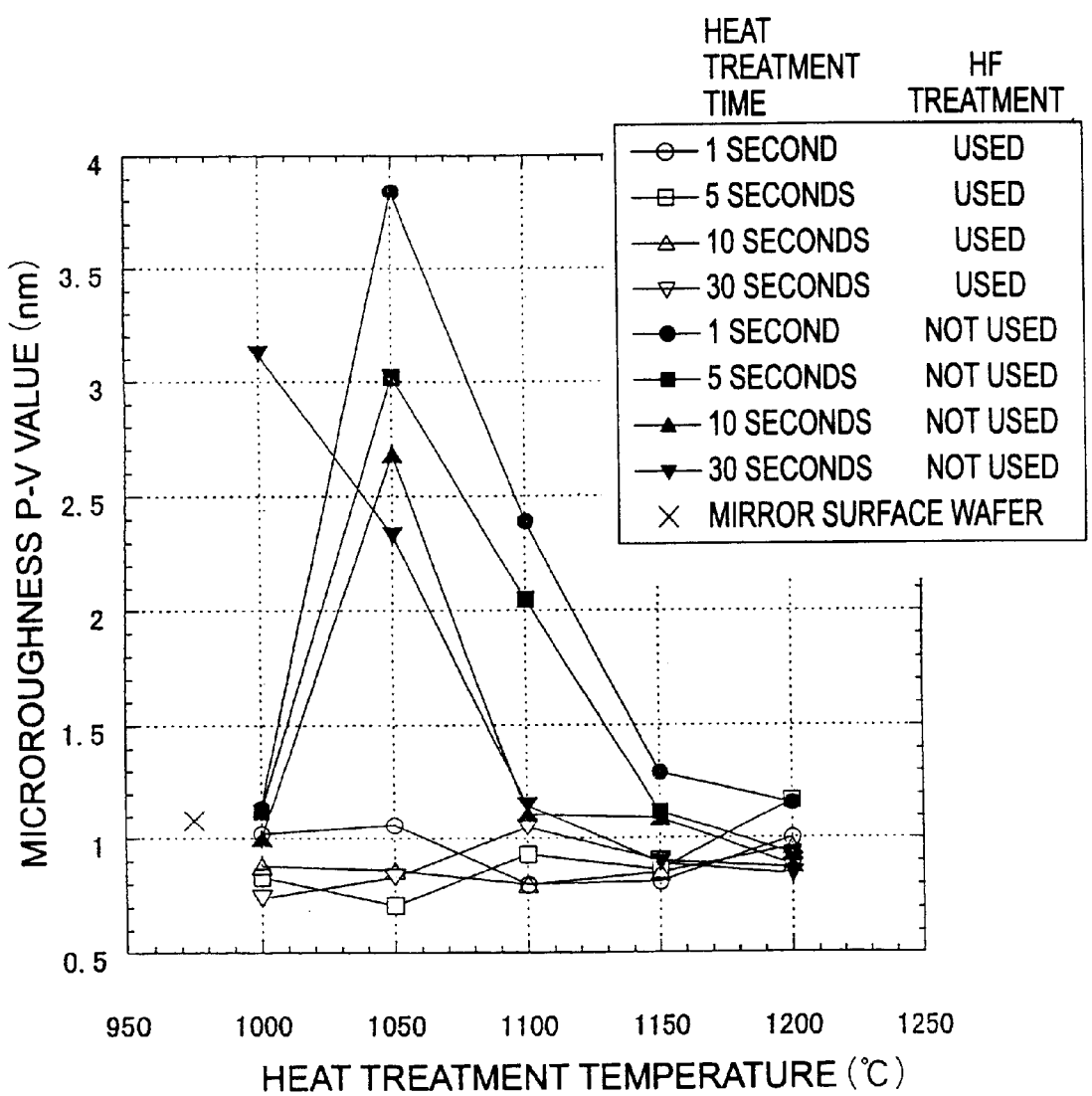
FIG. 2 shows relationship between heat treatment temperature in a rapid heating/rapid cooling apparatus and microroughness represented with P–V value after heat treatment, which is stratified for presence or absence of a natural oxide film on silicon wafer surface, and heat treatment time.
Figure 3:
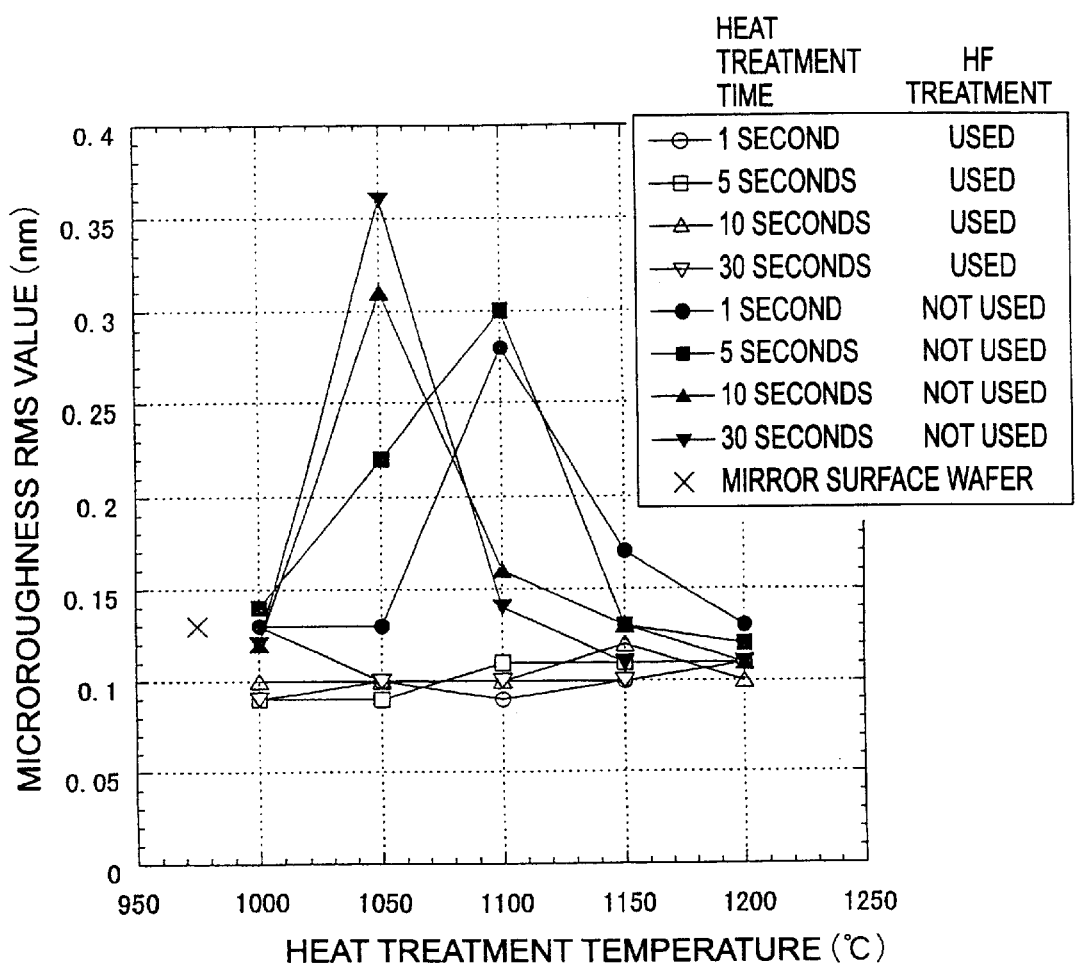
FIG. 3 shows relationship between heat treatment temperature in a rapid heating/rapid cooling apparatus and microroughness represented with RMS value after heat treatment, which is stratified for presence or absence of a natural oxide film on silicon wafer surface, and heat treatment time.

The results of a series of experiments are shown in FIG. 2 and FIG. 3. FIG. 2 shows the relationship between the heat treatment temperature and the microroughness represented by the P–V value for each heat treatment time with or without the hydrofluoric acid treatment. FIG. 3 shows the relationship between the heat treatment temperature and the microroughness represented by the RMS value for each heat treatment time with or without the hydrofluoric acid treatment.

Table 1 shows the relationship between the heat treatment conditions for the wafers that were subjected to the hydrofluoric acid treatment and the obtained microroughness (RMS values and P–V values). Table 2 shows the relationship between the heat treatment conditions for the wafers that were not subjected to the hydrofluoric acid treatment and the obtained microroughness (RMS values and P–V values).

TABLE 1

Silicon wafers whose natural oxide films were removed by hydrofluoric acid treatment

| Heat treatment conditions | Microroughness | |
|---|---|---|
| (° C. and second) | RMS (nm) | P-V (nm) |
| 1000 · 1 | 0.13 | 1.02 |
| 1000 · 5 | 0.09 | 0.83 |
| 1000 · 10 | 0.10 | 0.88 |
| 1000 · 30 | 0.09 | 0.74 |
| 1050 · 1 | 0.10 | 1.06 |
| 1050 · 5 | 0.09 | 0.71 |
| 1050 · 10 | 0.10 | 0.86 |
| 1050 · 30 | 0.10 | 0.83 |
| 1100 · 1 | 0.09 | 0.80 |
| 1100 · 5 | 0.11 | 0.93 |
| 1100 · 10 | 0.10 | 0.80 |
| 1100 · 30 | 0.11 | 1.05 |
| 1150 · 1 | 0.10 | 0.81 |
| 1150 · 5 | 0.11 | 0.86 |
| 1150 · 10 | 0.12 | 0.85 |
| 1150 · 30 | 0.11 | 0.90 |
| 1200 · 1 | 0.11 | 1.00 |
| 1200 · 5 | 0.11 | 1.17 |
| 1200 · 10 | 0.10 | 0.96 |
| 1200 · 30 | 0.11 | 0.87 |
| Reference: Mirror surface wafer | 0.13 | 1.10 |

Scanning area: 2 μm × 2 μm

TABLE 2

Silicon wafers which were not subjected to hydrofluoric acid treatment

| Heat treatment conditions | Microroughness | |
|---|---|---|
| (° C. and second) | RMS (nm) | P-V (nm) |
| 1000 · 1 | 0.13 | 1.14 |
| 1000 · 5 | 0.14 | 1.12 |
| 1000 · 10 | 0.12 | 1.00 |
| 1000 · 30 | 0.12 | 3.12 |
| 1050 · 1 | 0.13 | 3.84 |
| 1050 · 5 | 0.22 | 3.02 |
| 1050 · 10 | 0.31 | 2.68 |
| 1050 · 30 | 0.36 | 2.33 |
| 1100 · 1 | 0.28 | 2.39 |
| 1100 · 5 | 0.30 | 2.05 |
| 1100 · 10 | 0.16 | 1.11 |
| 1100 · 30 | 0.14 | 1.15 |
| 1150 · 1 | 0.17 | 1.29 |
| 1150 · 5 | 0.13 | 1.12 |
| 1150 · 10 | 0.13 | 1.09 |

TABLE 2-continued

Silicon wafers which were not subjected to hydrofluoric acid treatment

| Heat treatment conditions | Microroughness | |
|---|---|---|
| (° C. and second) | RMS (nm) | P-V (nm) |
| 1150 · 30 | 0.11 | 0.89 |
| 1200 · 1 | 0.13 | 1.16 |
| 1200 · 5 | 0.12 | 0.93 |
| 1200 · 10 | 0.11 | 0.88 |
| 1200 · 30 | 0.11 | 0.84 |
| Reference: Mirror surface wafer | 0.13 | 1.10 |

Scanning area: 2 μm × 2 μm

The experimental results represented in these figures and tables show that, when the natural oxide films were present, the microroughness generally tended to be degraded or maintained at a similar level (not improved) as for both of the RMS value and the P–V value in the hydrogen annealing temperature range of 1000 to 1150° C. This is considered to be due to local etching of thinner portions of the natural oxide films by hydrogen and generation of pits caused by etching of the Si layers at a higher rate.

When the natural oxide films did not exist, for example, when they were removed by the hydrofluoric acid treatment, the microroughness was improved as for both of the RMS value and the P–V value in the hydrogen annealing temperature range of 1000 to 1200° C. This result is considered to be obtained by uniform etching of the Si layers, which was obtained thanks to the absence of the natural oxide films.

In such a case, the microroughness can be improved even within the relatively low temperature range of 1000 to 1100° C. The microroughness of a mirror-finished wafer was around 1.1 nm in terms of the P–V value and around 0.13 nm in terms of the RMS value. In contrast, when the wafers were treated by an RTA apparatus after their natural oxide films were removed, they showed a microroughness of 0.7 nm in terms of the P–V value and 0.09, nm in terms of the RMS value after the heat treatment at a low temperature of 1000° C. for 30 seconds, and thus the microroughness was markedly improved.

Therefore, if the natural oxide film is removed, the heat treatment can be performed at a temperature of, for example, 950 to 1150° C. That is, if the temperature is 1200° C. or higher as in the conventional techniques, there may be fears of generation of slips and contamination. Therefore, a temperature of 1150° C. or lower is preferred. On the other hand, in order to sufficiently improve the microroughness, a temperature of 950° C. or higher is preferred. As for the heat treatment time, sufficient effect can be obtained by performing the treatment for 1 second or more. Since the heat treatment for an unduly long period is useless, it can be performed for a period of 300 seconds or shorter.

As described above, when a silicon wafer is subjected to a heat treatment under a reducing atmosphere by using a rapid heating/rapid cooling apparatus, the present invention makes it possible to perform the heat treatment at a temperature lower than the conventional temperature by 50° C. or more, with the purpose of further improvement of microroughness and obviating the drawbacks of the heat treatment at a high temperature, by subjecting the wafer to the heat treatment after a natural oxide film is removed.

Then, influence of the reducing atmosphere was examined by changing the hydrogen gas concentration in the inert gas from 0 to 100% by volume. Argon was used for the remaining portion of the hydrogen gas.

As silicon wafers, used were mirror-finished wafers having a diameter of 8 inches and crystal orientation of <100>, whose natural oxide films were removed by immersing the wafers in 2% hydrofluoric acid (HF) solution for 3 minutes.

Three kinds of treatment temperature levels, 950° C., 1050° C. and 1150° C., were used for a treatment time of 30 seconds. A diagram of an exemplary heat treatment process is shown in FIG. 1.

For reference, haze (ppm) was also measured. For this measurement, SP-1 produced by KLA/Tencor Co., Ltd. was used. The haze was around 0.03 ppm for the mirror surface wafer, around 0.3 ppm for the wafer subjected to the heat treatment under a reducing atmosphere at 1200° C. using an RTA apparatus, and around 0.2 ppm for an epitaxial wafer. If the haze is at a level of around 0.3 ppm, no problem will be caused in the semiconductor device production process.

Figure 5:
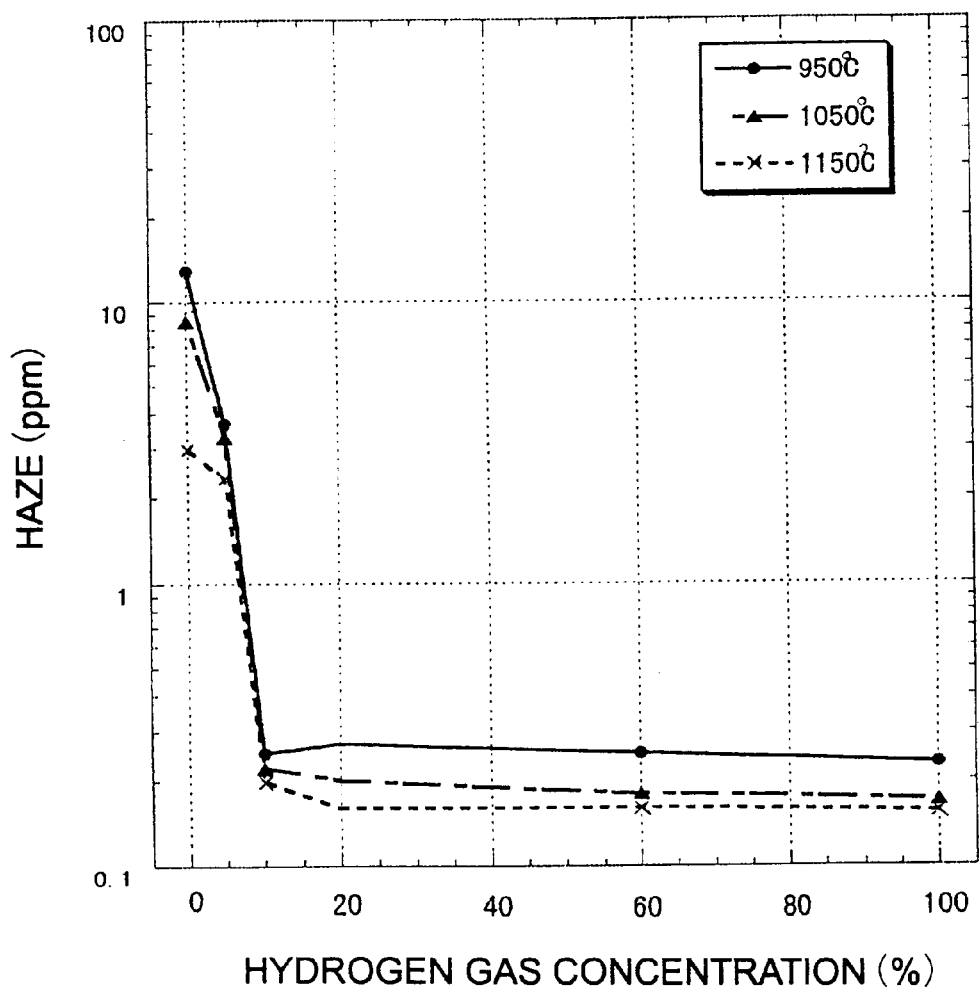
FIG. 5 shows relationship between hydrogen gas concentration in a rapid heating/rapid cooling apparatus and haze after heat treatment, which is stratified for heat treatment temperature.
Figure 6:
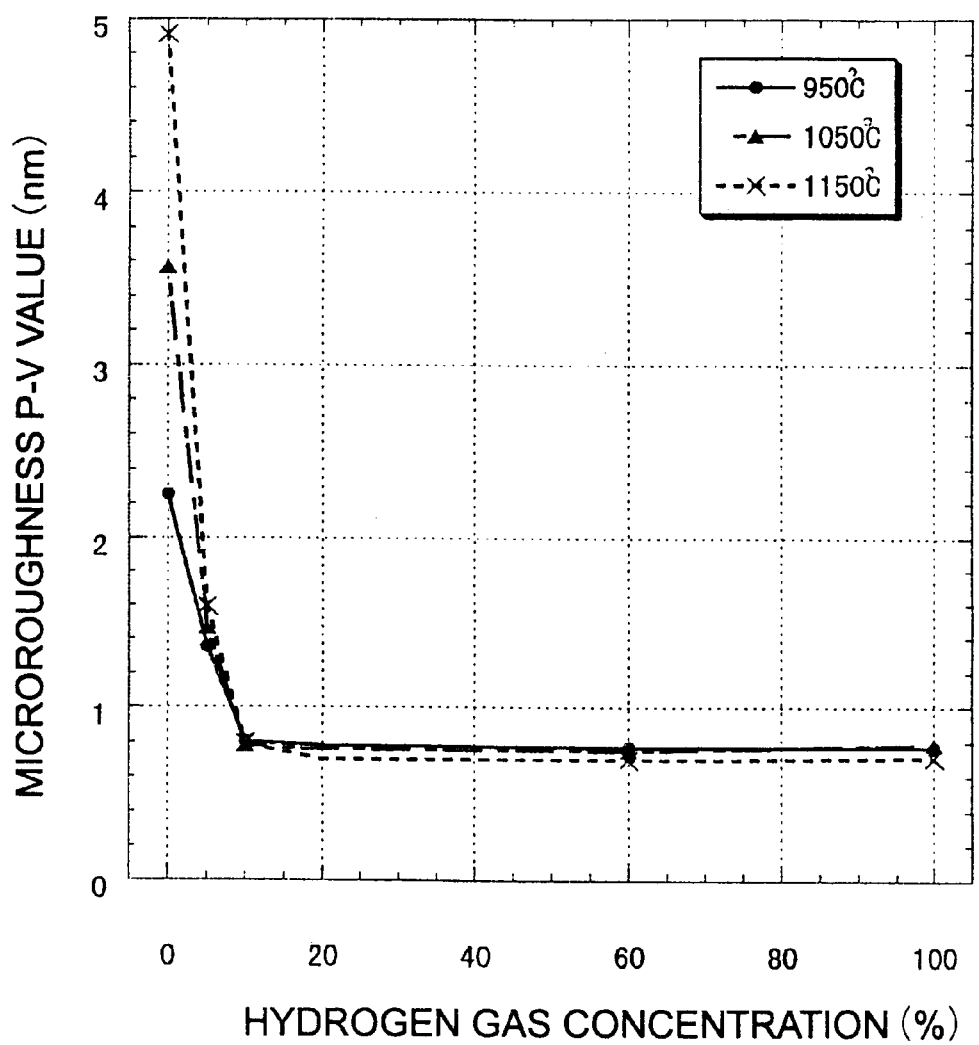
FIG. 6 shows relationship between hydrogen gas concentration in a rapid heating/rapid cooling apparatus and microroughness represented with P–V value after heat treatment, which is stratified for heat treatment temperature.
Figure 7:
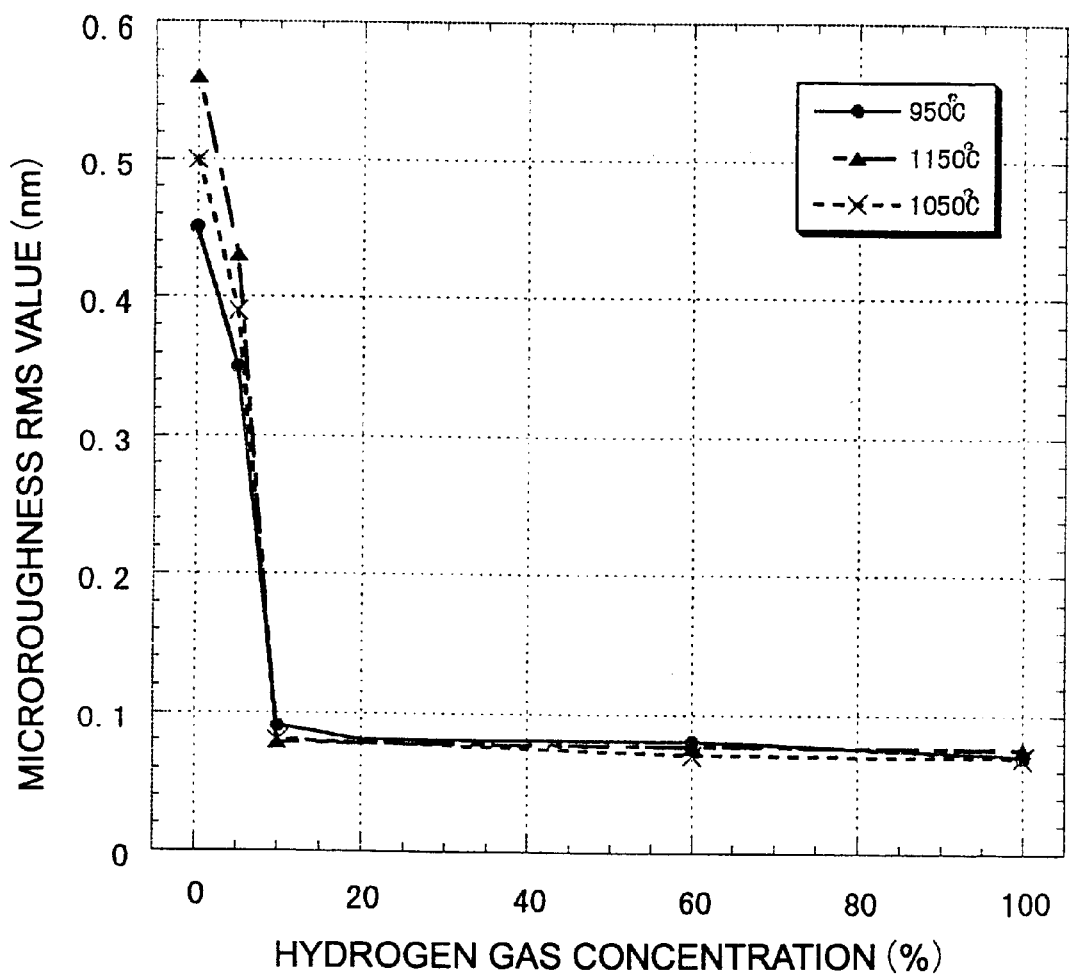
FIG. 7 shows relationship between hydrogen gas concentration in a rapid heating/rapid cooling apparatus and microroughness represented with RMS value after heat treatment, which is stratified for heat treatment temperature.

The results of a series of experiments are shown in FIGS. 5, 6 and 7. FIG. 5 shows the relationship between the hydrogen gas concentration and the haze for each heat treatment temperature. FIG. 6 shows the relationship between the hydrogen gas concentration and the microroughness represented by the P-V value for each heat treatment temperature. FIG. 7 shows the relationship between the hydrogen gas concentration and the microroughness represented by the RMS value for each heat treatment temperature.

The experimental results shown in these figures indicate that, when natural oxide films did not exist, the microroughness was sufficiently improved and maintained at a substantially constant level as for both of the RMS value and the P-V value in the hydrogen concentration range of from 10% to 100%. However, if the hydrogen concentration became less than 10%, the microroughness was abruptly degraded, and it was degraded by a degree of several times at 0% of the hydrogen concentration compared with the mirror surface wafer.

Haze, which was measured for reference, showed a tendency similar to that of the microroughness, as shown in FIG. 5. However, the haze was slightly influenced by the temperature, and it was more improved, as the temperature became higher.

The results shown above indicate that hydrogen has an ability to react with Si to cause migration of Si and thereby flatten the surface (improve haze). However, if the concentration of hydrogen is low, that ability becomes insufficient, and therefore the surface is roughened and haze is degraded (see FIG. 5). This phenomenon was caused because inert gas such as argon or nitrogen gas did not have such ability to flatten the surface at all. This phenomenon was also seen for the microroughness. In the hydrogen concentration range of 0 to 10%, the microroughness was more degraded as the hydrogen concentration became lower, because of a low hydrogen concentration (FIG. 6, FIG. 7). Therefore, it is desirable that the reducing atmosphere for the heat treatment should consist of 100% of hydrogen or a mixed gas atmosphere of argon and/or nitrogen containing 10% or more of hydrogen.

By subjecting wafers to the aforementioned heat treatment, the microroughness can be further improved compared with that obtained by the conventional high temperature heat treatment, and improvement of electric characteristics such as the oxide dielectric breakdown voltage and the mobility of carriers can also be contemplated. Further, because of the use of a relatively low temperature, substantially no slip dislocations are generated, and thus there can be obtained silicon wafers of extremely high quality useful for semiconductor devices, which are also free from the heavy metal contamination.

Furthermore, since time and thermal energy required for temperature increase and decrease in the rapid heating/rapid cooling apparatus can also be reduced by the use of a relatively low temperature for the heat treatment, improvement of yield and productivity, and cost reduction can also be contemplated.

Embodiments of the present invention will be explained hereafter with reference to the appended drawings. However, the present invention is not limited to these.

FIG. 4 shows apparatuses used for the present invention, which can realize rapid heating and rapid cooling of a silicon wafer under a reducing atmosphere.

Figure 4A:
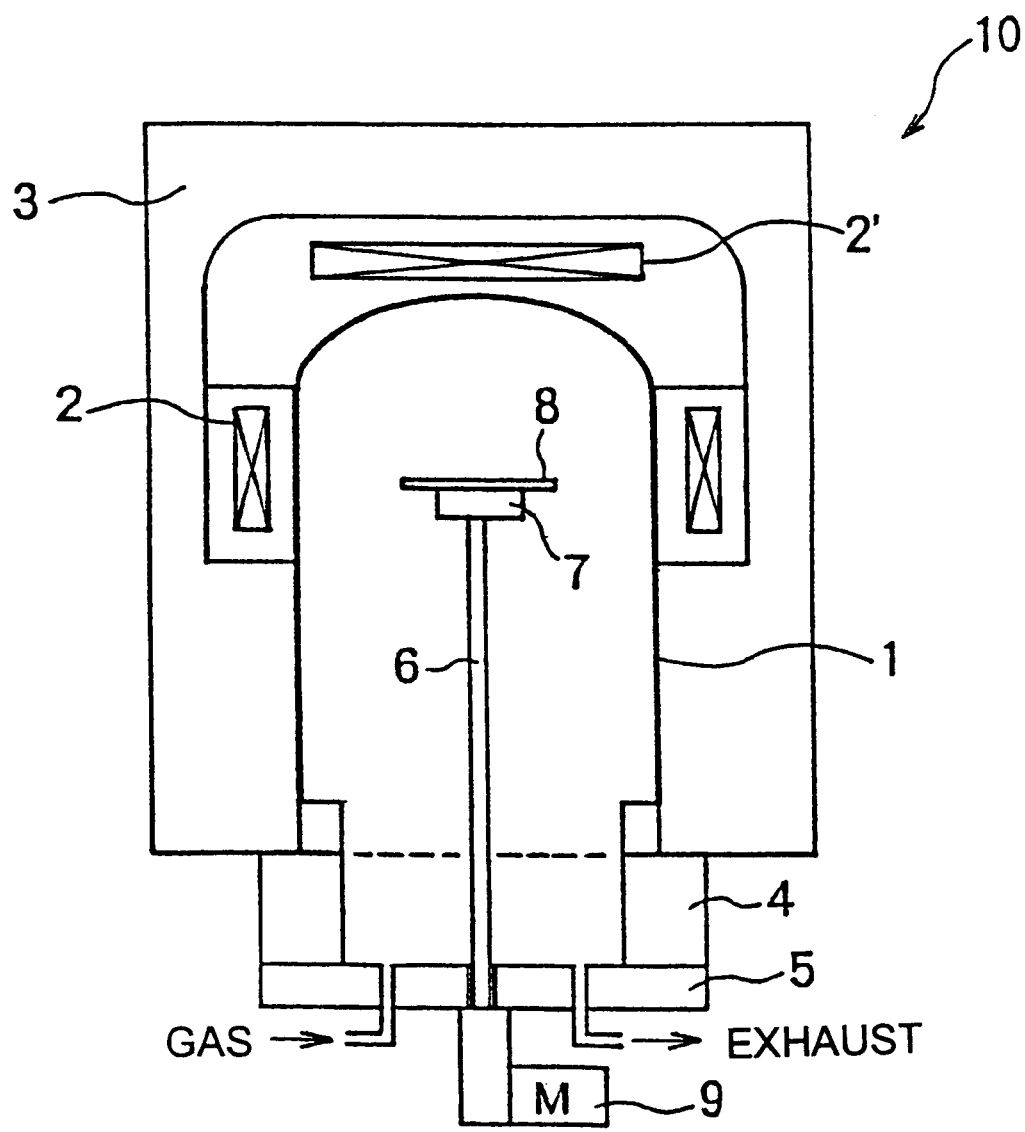

The heat treatment apparatus 10 shown in FIG. 4A comprises a bell jar 1 composed of, for example, silicon carbide or quartz, and a wafer is heat-treated in this bell jar 1. Heating is attained by heaters 2 and 2', which are disposed so that they should surround the bell jar 1. These heaters constitute a top part and a bottom part, and electric power supplied to them can be independently controlled. A housing 3 is disposed surrounding the heaters 2 and 2' for shielding heat. Of course, the heating mechanism is not limited to this, and the so-called radiant heating, high-frequency heating and so forth may also be used.

A water cooled chamber 4 and a base plate 5 are disposed under a furnace, and they shut the inside of the bell jar 1 off from the outer air. A wafer 8 is held on a stage 7, and the stage 7 is fixed at the top of supporting shaft 6, which can be freely moved upward and downward by a motor 9. The water cooled chamber 4 has a wafer insertion port (not shown in the figure) which can be opened and closed by a gate valve, so that the wafer can be put into and taken out from the furnace along the transverse direction. The base plate 5 is provided with a gas inlet and exhaust outlet, so that the gaseous atmosphere in the furnace can be controlled.

By using the heat treatment apparatus 10 mentioned above, the heat treatment under a reducing atmosphere containing hydrogen for rapid heating and rapid cooling of silicon wafer whose natural oxide film is removed is performed, for example, in accordance with a process shown in the diagram of FIG. 1.

For the heat treatment, the inside of the bell jar 1 is first heated to a temperature of, for example, from 950 to 1150° C., and maintained at that temperature by the heaters 2 and 2'. By independently controlling electric power supplied to the separated heaters, temperature distribution can be provided in the bell jar 1 along its height direction. Therefore, the heat treatment temperature for the wafer can be selected by changing the position of the stage 7, i.e., the length of the supporting shaft 6 inserted into the furnace.

After the inside of the bell jar 1 is maintained at a desired temperature, a silicon wafer is inserted from the insertion port of the water cooled chamber 4 by a wafer handling apparatus not shown in the figure, which is disposed at a neighboring position of the heat treatment apparatus 10, and placed on the stage 7 waiting at its lowest position via, for example, a SiC boat. At this point, the water cooled chamber 4 and the base plate 5 are cooled with water, and therefore the wafer is not heated to a high temperature at this position.

Then, after the silicon wafer 8 is placed on the stage 7, the stage 7 is immediately elevated to a position of a desired temperature of from 950° C. to 1150° C. by inserting the supporting shaft 6 into the inside of the furnace by the motor 9 so that the wafer on the stage should be subjected to the heat treatment. In this operation, because the stage moves from its lowest position in the water cooled chamber 4 to the desired temperature position within, for example, only 20 seconds, the wafer will be rapidly heated.

Then, by maintaining the stage 7 at the desired temperature position for a predetermined period of time (1 to 300 seconds), the wafer can be subjected to the heat treatment at a relatively low temperature under a reducing atmosphere containing hydrogen to an extent corresponding to the predetermined period in which the wafer is maintained at the desired temperature position. When the predetermined time has passed and the heat treatment at a relatively low temperature was finished, the stage 7 is immediately descended by pulling the supporting shaft 6 out from the furnace by the motor 9, and positioned at the bottom of the water cooled chamber 4. This descending operation can also be performed within, for example, about 20 seconds. Because the water cooled chamber 4 and the base plate 5 are cooled with water, the silicon wafer 8 on the stage 7 is cooled rapidly. Finally, the silicon wafer is taken out by the wafer handling apparatus to finish the heat treatment.

When additional silicon wafers are to be heat-treated, those silicon wafers can be introduced successively into the apparatus and subjected to the heat treatment, since the temperature in the heat treatment apparatus 10 is not lowered.

Now, another example of the rapid heating/rapid cooling apparatus (RTA apparatus) for silicon single crystal wafers used for the present invention will be explained. FIG. 4B is a schematic view of an RTA apparatus.

The heat treatment apparatus 20 shown in FIG. 4B has a chamber 11 consisting of quartz, and a wafer 18 is heat treated within this chamber 11. Heating is achieved by heat lamps 12, which are disposed under and over the chamber and at left and right of the chamber so that they should surround the chamber 11. Electric power supplied to these lamps 12 can be independently controlled.

An auto shutter 13 is provided at the gas exhausting side, and it shuts the inside of the chamber 11 off from the outer air. The auto shutter 13 has a wafer insertion port (not shown in the figure) which can be opened and closed by a gate valve. The auto shutter 13 is also provided with a gas exhausting outlet, so that the atmosphere in the furnace can be controlled.

A wafer 18 is placed on a three-point supporting part 15 formed on a quartz tray 14. A buffer 16 made of quartz is provided at the gas inlet side of the tray 14, so that it can prevent the wafer 18 from being directly blown by the introduced gas flow.

Further, the chamber 11 is provided with a special window for temperature measurement, which is not shown in the figure, and the temperature of the wafer 18 can be measured by a pyrometer 17 installed in the outside of the chamber 11 through the special window.

By using the heat treatment apparatus 20 mentioned above, the heat treatment for rapid heating and rapid cooling of silicon wafers is performed as follows.

First, the wafer 18 is inserted into the chamber 11 from the insertion port and placed on the tray 14 by a wafer handling apparatus not shown in the figure. Then, the auto shutter 13 is closed.

Subsequently, electric power is supplied to the heat lamps 22 to heat the wafer 18 to a predetermined temperature, for example, 1100 to 1300° C. In this operation, it takes, for example, about 20 seconds to attain the desired temperature. Then, the wafer 18 is maintained at the temperature for a predetermined period of time, and thus it can be subjected to a high temperature heat treatment. When the predetermined time has passed and the high temperature heat treatment was finished, output of the lamps is reduced to lower the temperature of the wafer. This temperature decrease can also be attained within, for example, about 20 seconds. Finally, the wafer 18 is taken out by the wafer handling apparatus to finish the heat treatment.

As explained above, the heat treatment comprising rapid heating and rapid cooling by using a rapid heating/rapid cooling apparatus (RTA apparatus) according to the present invention include a method utilizing such an apparatus as shown in FIG. 4A, wherein a wafer is immediately introduced into a heat treatment furnace set at a temperature within the aforementioned temperature range, and the wafer is immediately taken out after the predetermined time has passed, a method utilizing such an apparatus as shown in FIG. 4B, wherein a wafer is placed at a predetermined position in a heat treatment furnace and immediately heated by lamp heaters or the like, and so forth. The expressions of "to immediately introduce" and "to immediately take out" mean that there are not employed the conventional temperature increasing and decreasing operations performed over a certain period of time and the so-called loading and unloading operations in which wafers are slowly introduced into and taken out from a heat treatment furnace. Of course, however, it takes a certain short period of time to transport the wafer to the predetermined position in the furnace, and it takes several seconds to several minutes depending on the performance of a transportation apparatus for introducing a wafer.

As the aforementioned reducing heat treatment atmosphere, 100% hydrogen atmosphere can be used, or a mixed gas atmosphere of argon and/or nitrogen which contains 10% or more of hydrogen can be used for the reasons of control of reducing power obtained by hydrogen, safety and so forth. In the latter case, the hydrogen concentration in the mixed gas is preferably about 20% to 70%.

Such a reducing heat treatment atmosphere makes it possible to maintain the state of a wafer whose natural oxide film is removed and thereby surely improves microroughness on the wafer surface. At the same time, it also possible to attain improvement of crystal defects existing on the surface of the silicon wafer.

According to the present invention, the natural oxide film is desirably removed by a hydrofluoric acid treatment. For example, it will be sufficient if a wafer is immersed into a 2% HF aqueous solution for around 3 minutes. Alternatively, a wafer may be treated in a gaseous phase that consists of hydrogen atmosphere containing about 1% of HF gas for about 5 minutes.

$SiO_2$ constituting the natural oxide film can easily and surely removed by the immersion in hydrofluoric acid (HF) or the treatment in such a gaseous phase, and it does not substantially affect adversely the original flatness, microroughness and so forth of mirror-finished wafers before the treatment.

Furthermore, because the microroughness on surfaces of silicon wafers is reduced by the method for heat treatment of the present invention, there can be obtained silicon wafers useful for semiconductor devices, which have improved electric characteristics such as the oxide dielectric breakdown voltage, the mobility of carriers etc., and are substantially free from generation of slip dislocations and heavy metal contamination, with high yield and high productivity.

In particular, there can be obtained silicon wafers showing microroughness of 1.00 nm or less in terms of the P–V value and 0.12 nm or less in terms of the RMS value measured for a 2 μm square by an atomic force microscope.

The present invention is not limited to the embodiments described above. The above-described embodiments are mere examples, and those having the substantially same structure as that described in the appended claims and providing the similar functions and advantages are included in the scope of the present invention.

For example, while such heat treatment apparatuses as shown in FIG. 4 are used in the aforementioned embodiments, the present invention should not necessarily be practiced by such apparatuses, and any apparatuses may be used, in principle, so long as the apparatuses can realize rapid heating and rapid cooling of silicon wafers and can heat the wafers to a temperature of 950° C. or higher.

Further, while the embodiments mentioned above were explained for the heat treatment of silicon wafers having a diameter of 8 inches, the present invention can be used regardless of the wafer diameter, and can be used for a silicon wafer having a diameter of, for example, 10 to 16 inches or more.

What is claimed is:

1. A method for heat treatment of a silicon wafer under a reducing atmosphere using a rapid heating/rapid cooling apparatus, the method comprising:

removing a natural oxide film on a silicon wafer surface; and then subjecting the silicon wafer to a heat treatment under an atmosphere of 100% hydrogen, or a mixed gas atmosphere of at least one of argon and nitrogen containing 10% or more of hydrogen, using a rapid heating/rapid cooling apparatus.

2. The method for heat treatment of a silicon wafer according to claim 1, wherein the heat treatment is performed at a temperature of 950 to 1150° C. for 1 to 300 seconds.

3. The method for heat treatment of a silicon wafer according to claim 1, wherein the natural oxide film is removed by hydrofluoric acid treatment.

4. The method for heat treatment of a silicon wafer according to claim 2, wherein the natural oxide film is removed by hydrofluoric acid treatment.

5. A silicon wafer which is heat-treated by the method of heat treatment according to claim 1.

6. A silicon wafer which is heat-treated by the method of heat treatment according to claim 2.

7. A silicon wafer which is heat-treated by the method of heat treatment according to claim 3.

8. A silicon wafer which is heat-treated by the method of heat treatment according to claim 4.

* * * * *